United States Patent
Seidl

(10) Patent No.: US 7,626,190 B2
(45) Date of Patent: Dec. 1, 2009

(54) MEMORY DEVICE, IN PARTICULAR PHASE CHANGE RANDOM ACCESS MEMORY DEVICE WITH TRANSISTOR, AND METHOD FOR FABRICATING A MEMORY DEVICE

(75) Inventor: Harald Seidl, Pöring (DE)

(73) Assignee: Infineon Technologies AG, Neubiberg (DE)

( * ) Notice: Subject to any disclaimer, the term of this patent is extended or adjusted under 35 U.S.C. 154(b) by 257 days.

(21) Appl. No.: 11/445,801

(22) Filed: Jun. 2, 2006

(65) Prior Publication Data

US 2007/0278530 A1    Dec. 6, 2007

(51) Int. Cl.
*H01L 29/02* (2006.01)
(52) U.S. Cl. .................. 257/2; 257/4; 257/9; 257/213; 257/E29.002; 365/163; 977/936; 977/762; 977/773; 977/932
(58) Field of Classification Search ................. 257/1–5, 257/9, 213, E29.002; 438/102–103; 365/163; 977/762, 773, 932, 936
See application file for complete search history.

(56) References Cited

U.S. PATENT DOCUMENTS

| | | | |
|---|---|---|---|
| 2002/0175408 A1* | 11/2002 | Majumdar et al. | .......... 257/734 |
| 2004/0233769 A1 | 11/2004 | Matsuoka et al. | |
| 2004/0251551 A1 | 12/2004 | Hideki | |
| 2005/0029654 A1 | 2/2005 | Mio et al. | |
| 2005/0051805 A1 | 3/2005 | Kim et al. | |
| 2005/0180189 A1* | 8/2005 | Happ et al. | .................. 365/145 |
| 2006/0034116 A1 | 2/2006 | Lam et al. | |
| 2006/0097306 A1 | 5/2006 | Kim et al. | |
| 2007/0183189 A1* | 8/2007 | Nirschl et al. | ................ 365/163 |

FOREIGN PATENT DOCUMENTS

| | | |
|---|---|---|
| CN | 158851 | 3/2005 |
| DE | 10331528 | 2/2005 |
| EP | 1748503 | 1/2007 |
| KR | 2006-45165 A | 5/2006 |
| WO | 2006003620 | 1/2006 |
| WO | 2006035325 | 4/2006 |

* cited by examiner

*Primary Examiner*—Thanh V Pham
*Assistant Examiner*—Jami M Valentine
(74) *Attorney, Agent, or Firm*—Dicke, Billig & Czaja, PLLC

(57) ABSTRACT

A memory device, in particular to a resistively switching memory device such as a Phase Change Random Access Memory ("PCRAM"), with a transistor is disclosed. Further, the invention relates to a method for fabricating a memory device. According one embodiment of the invention, a memory device is provided, having at least one nanowire or nanotube or nanofibre access transistor. In one embodiment, the nanowire or nanotube or nanofibre access transistor directly contacts a switching active material of the memory device. According to an additional embodiment, a memory device includes at least one nanowire or nanotube or nanofibre transistor with a vertically arranged nanowire or nanotube or nanofibre.

8 Claims, 19 Drawing Sheets

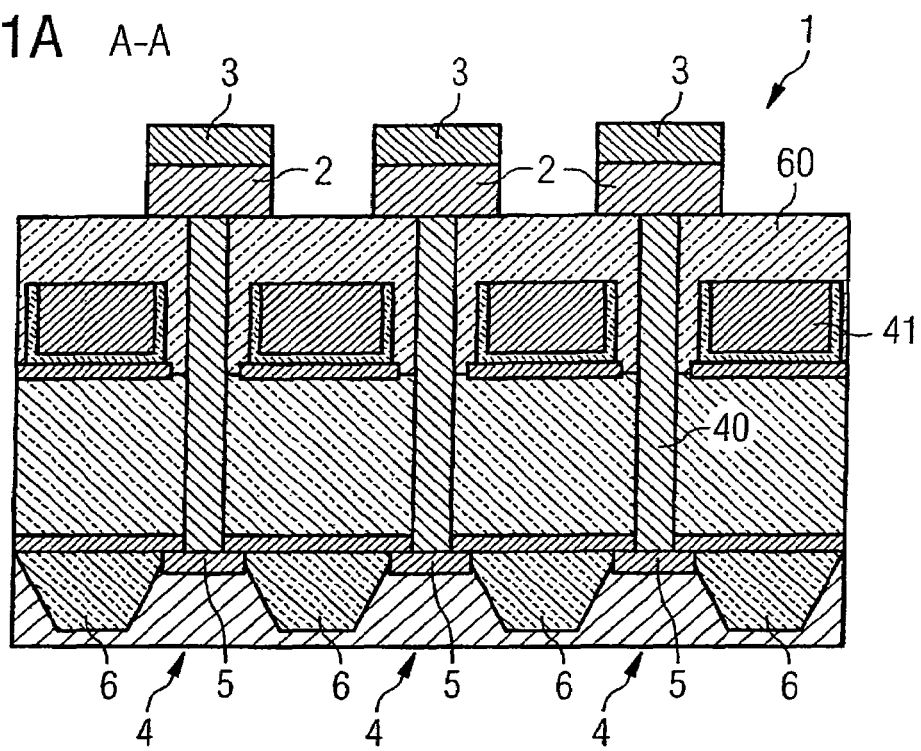
FIG 1A  A-A
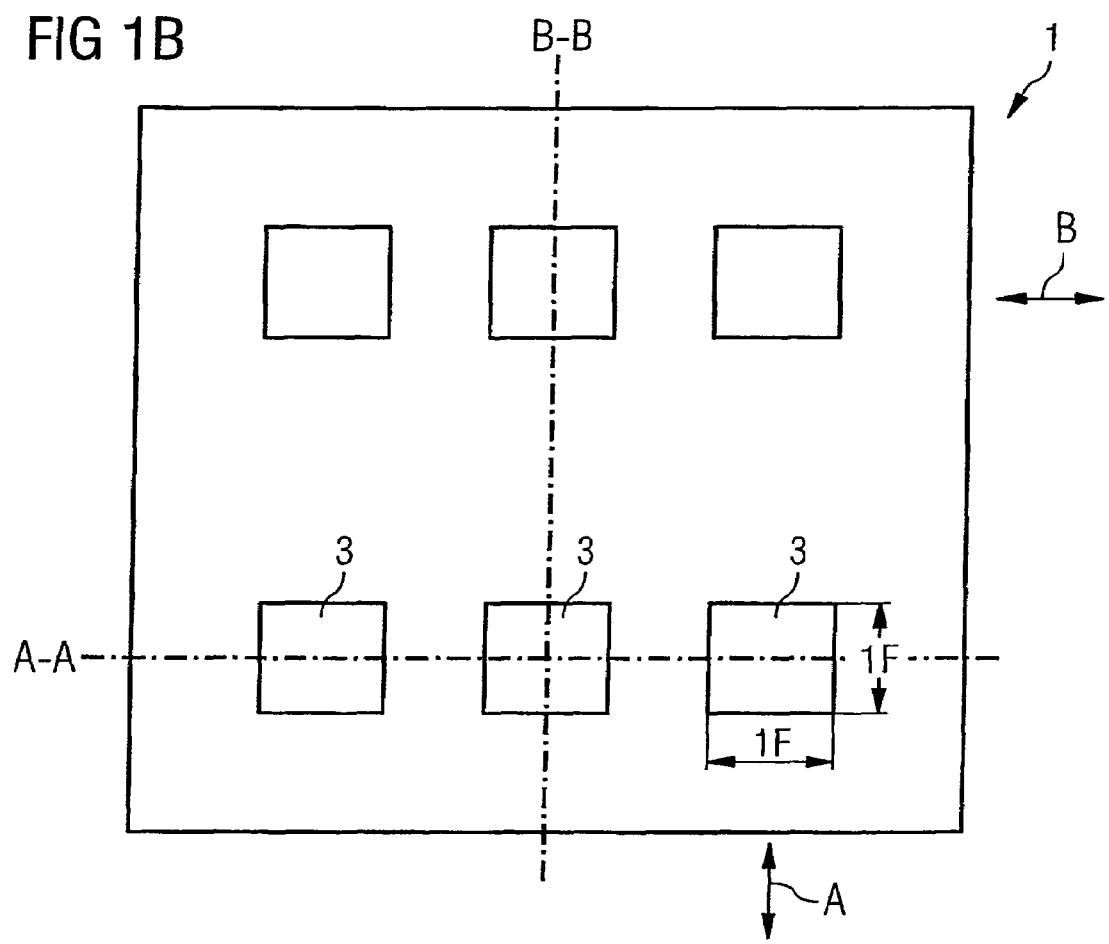
FIG 1B

FIG 2A  A-A
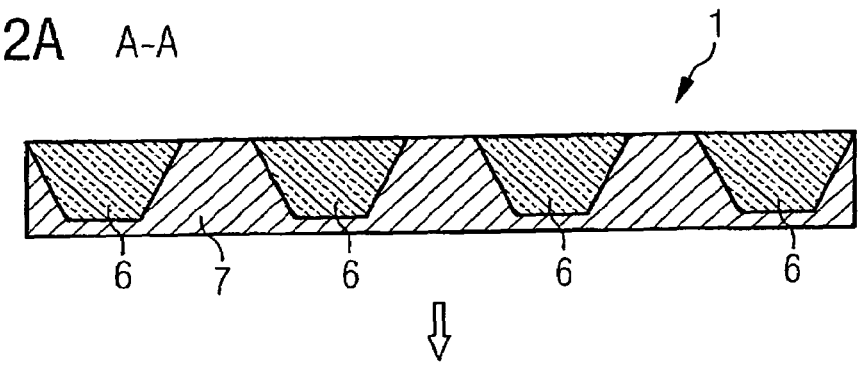
FIG 2B
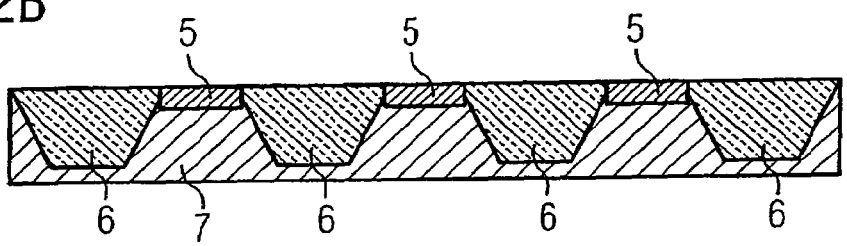
FIG 2C
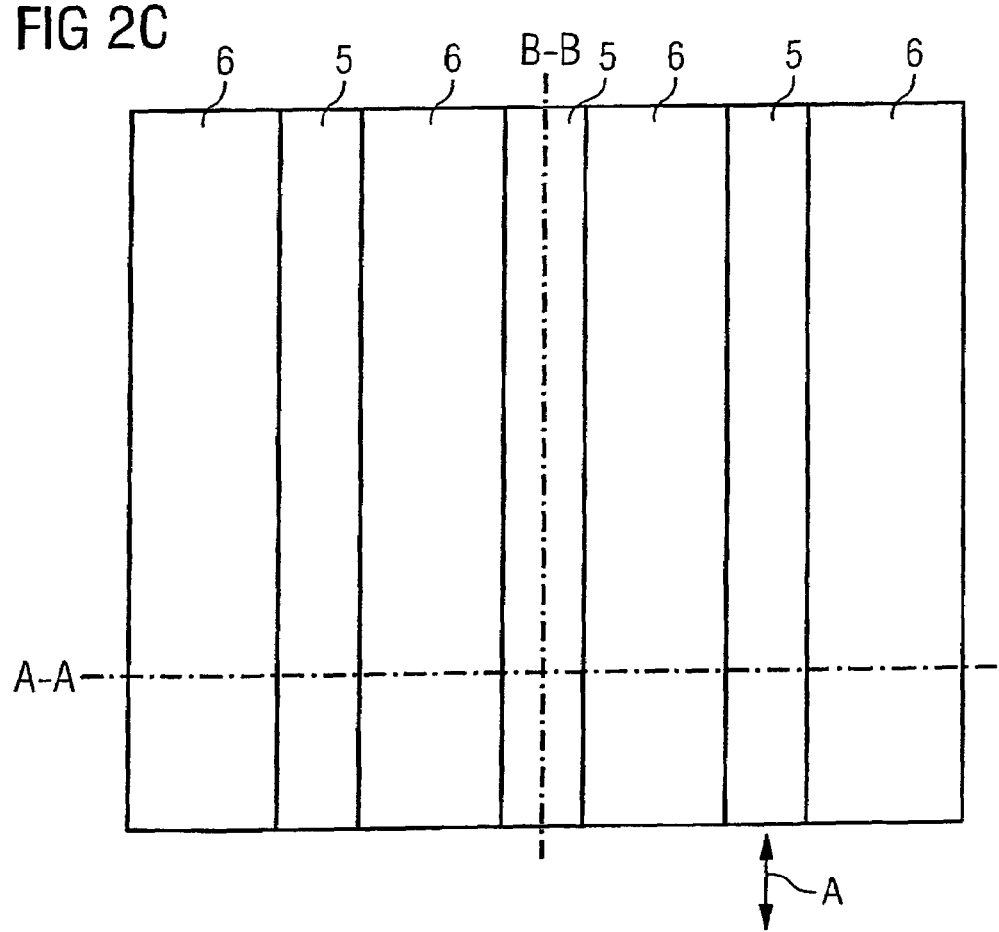

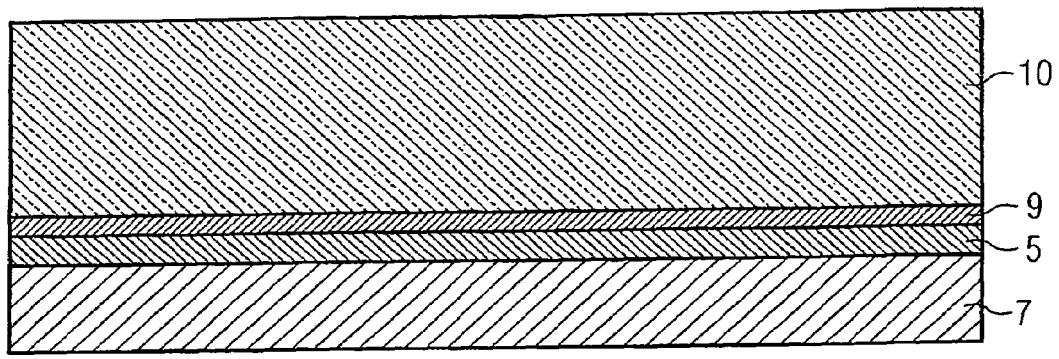
FIG 3A B-B
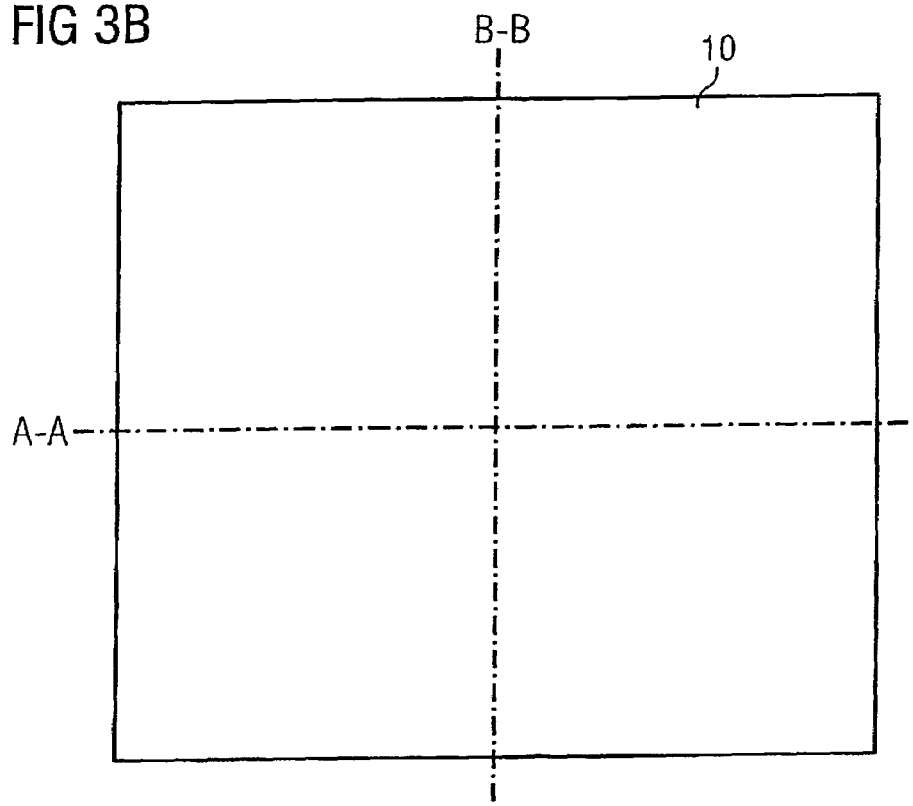
FIG 3B

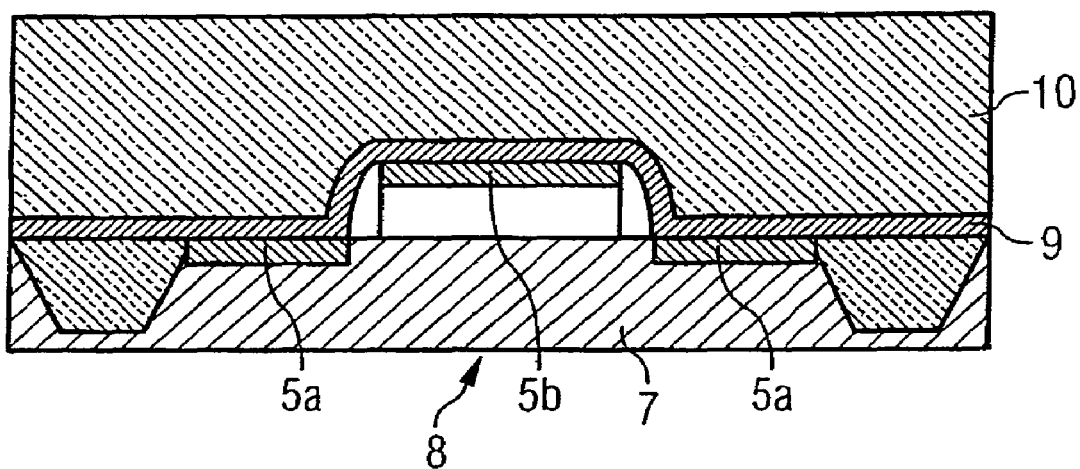
FIG 3C  A-A

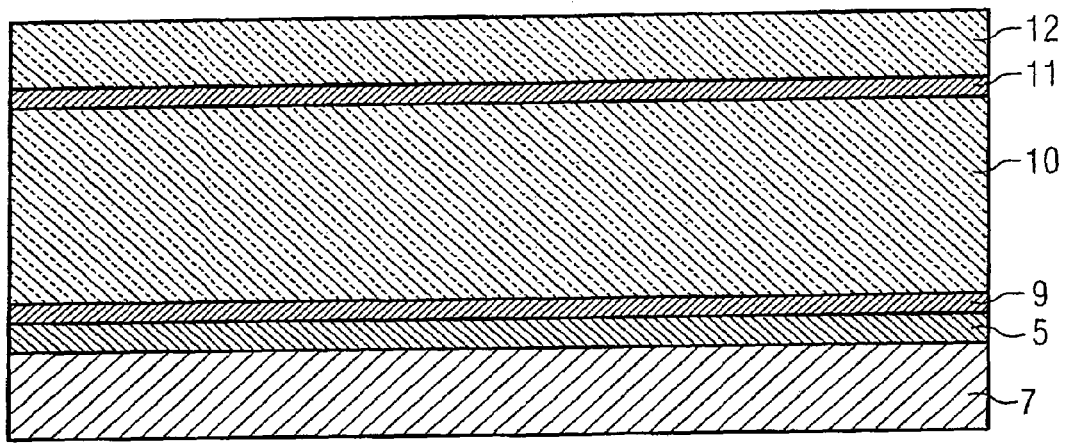
FIG 4A  B-B
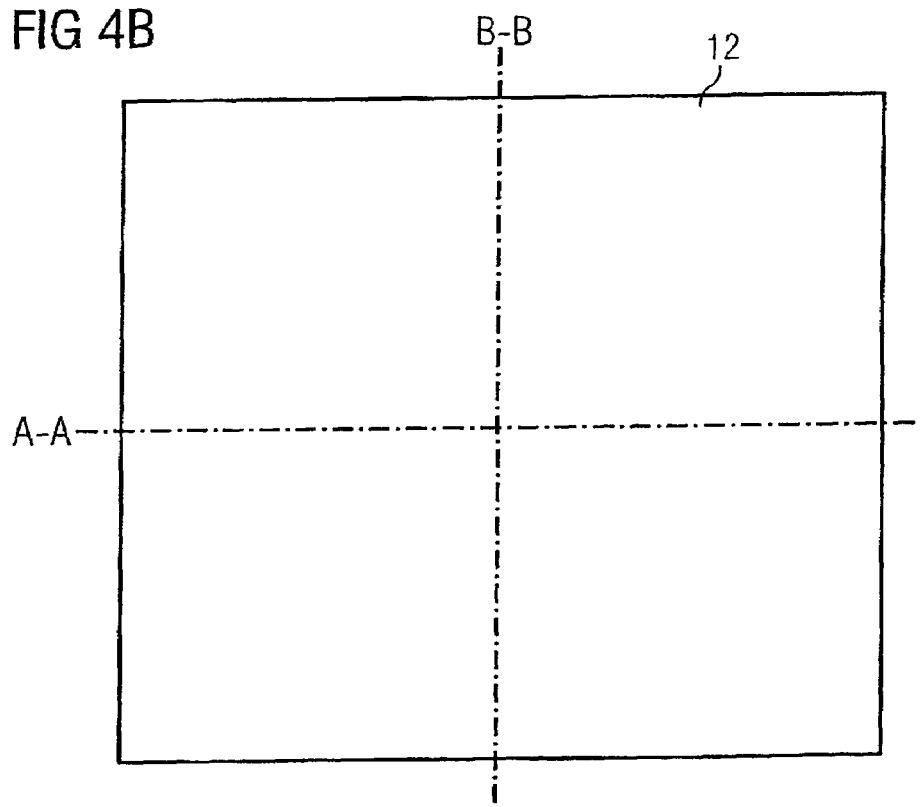
FIG 4B

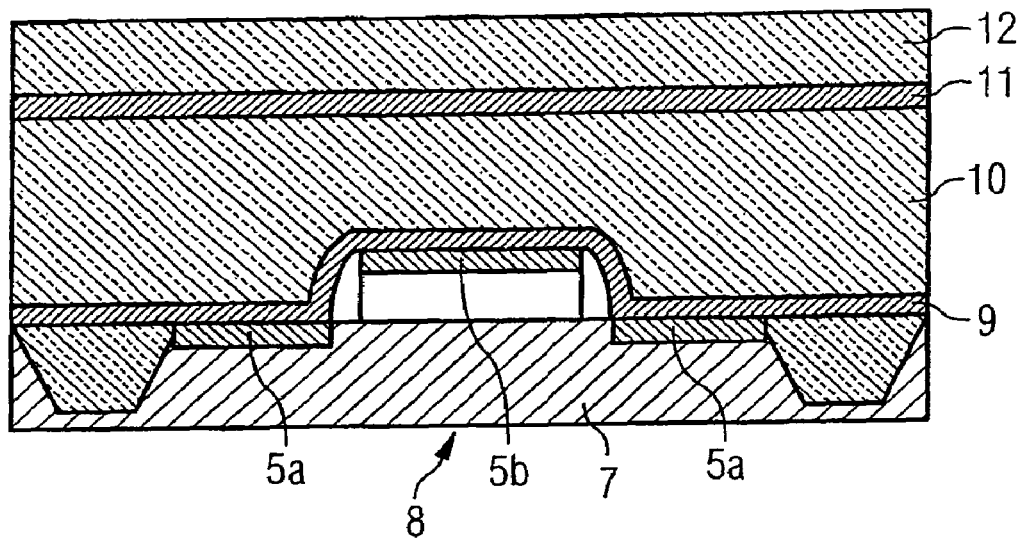
FIG 4C A-A

FIG 5A  B-B
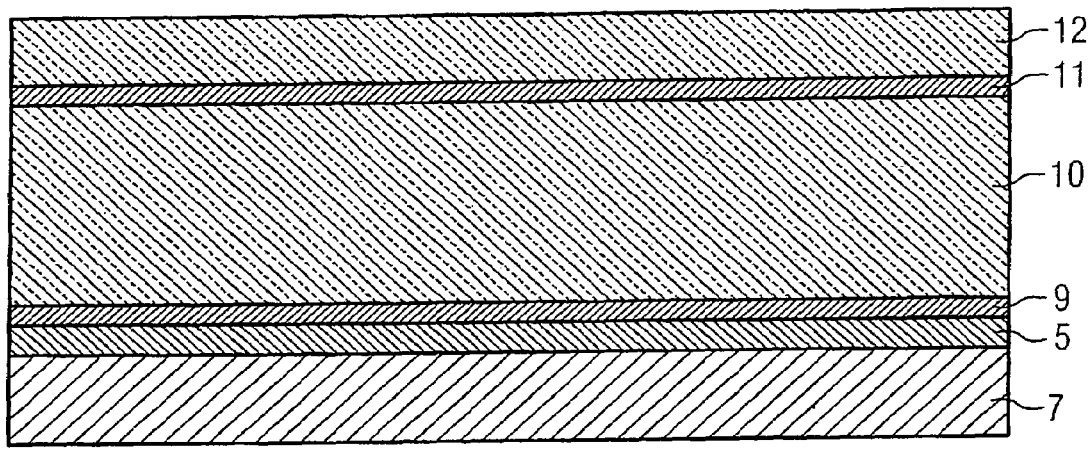
FIG 5B
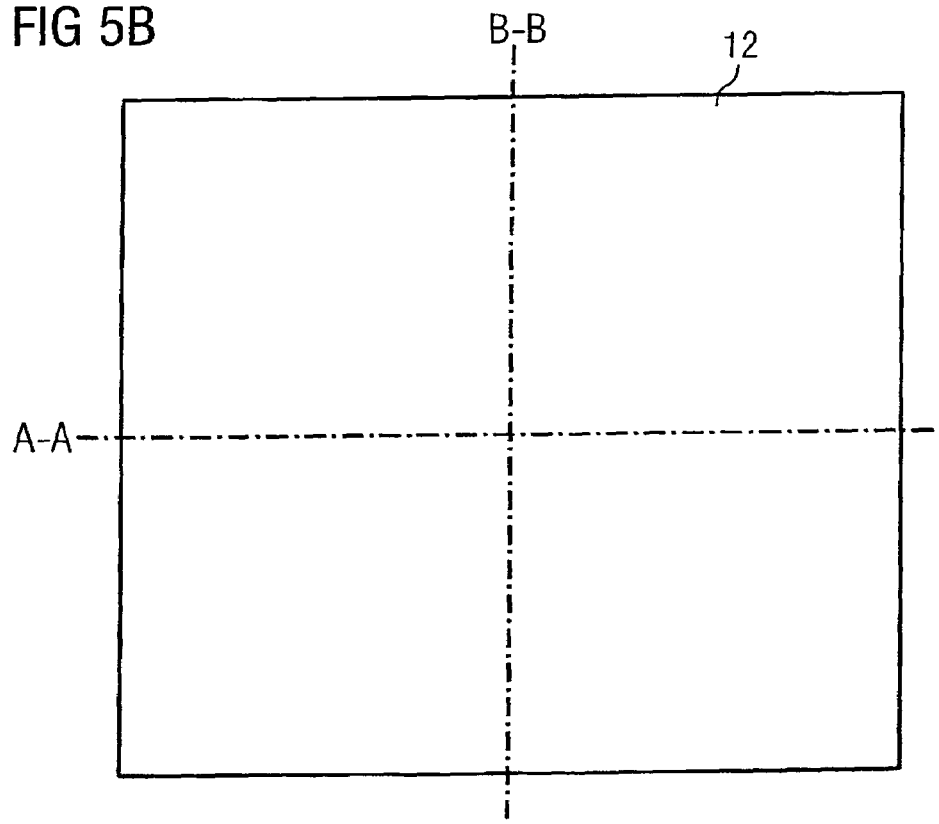

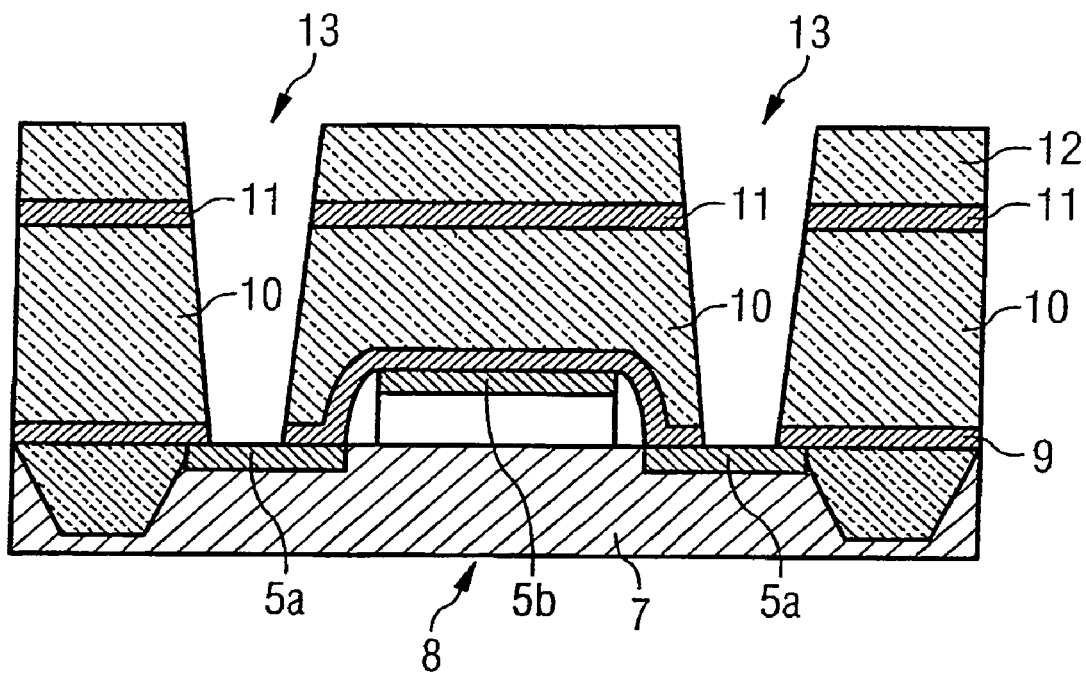
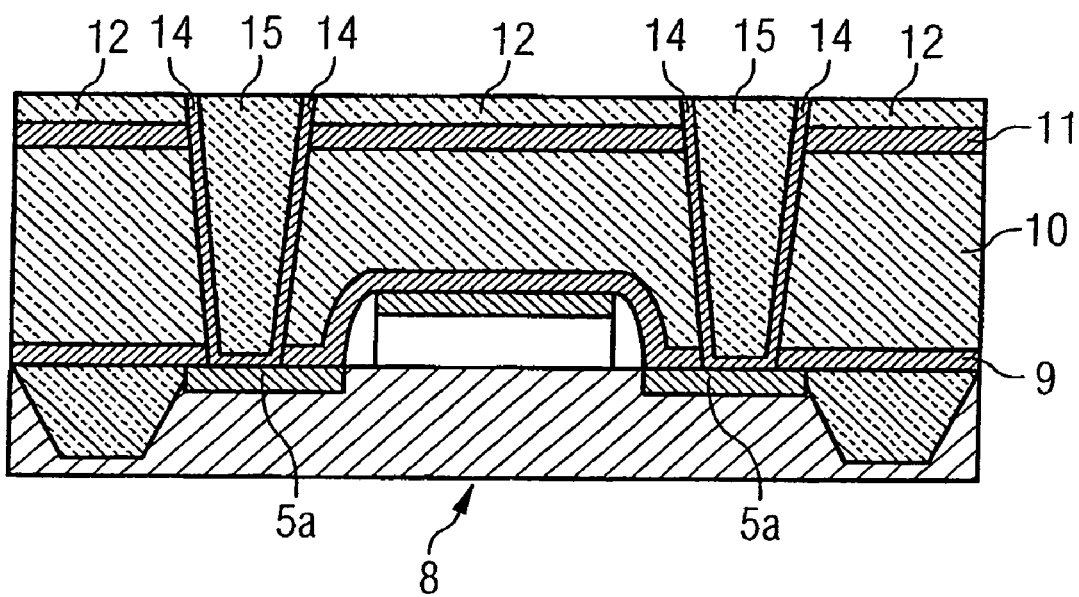

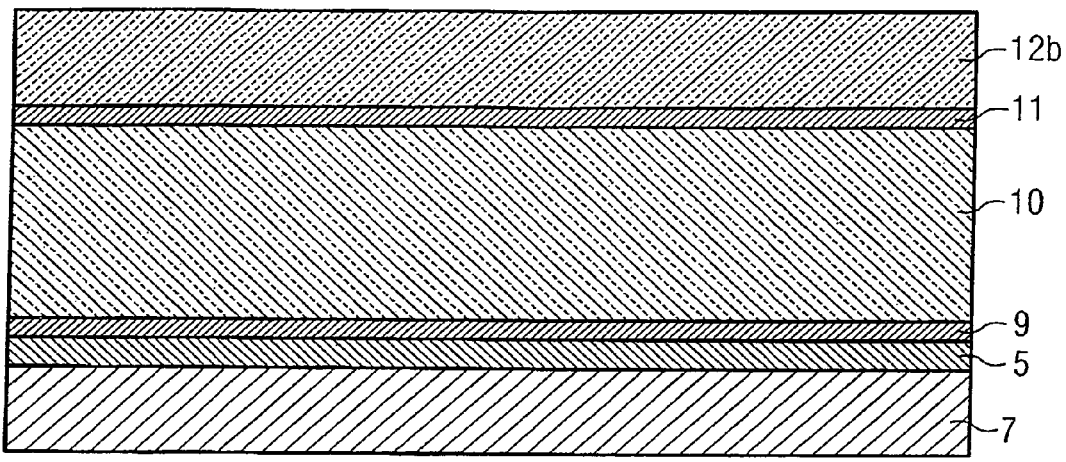
FIG 7A B-B
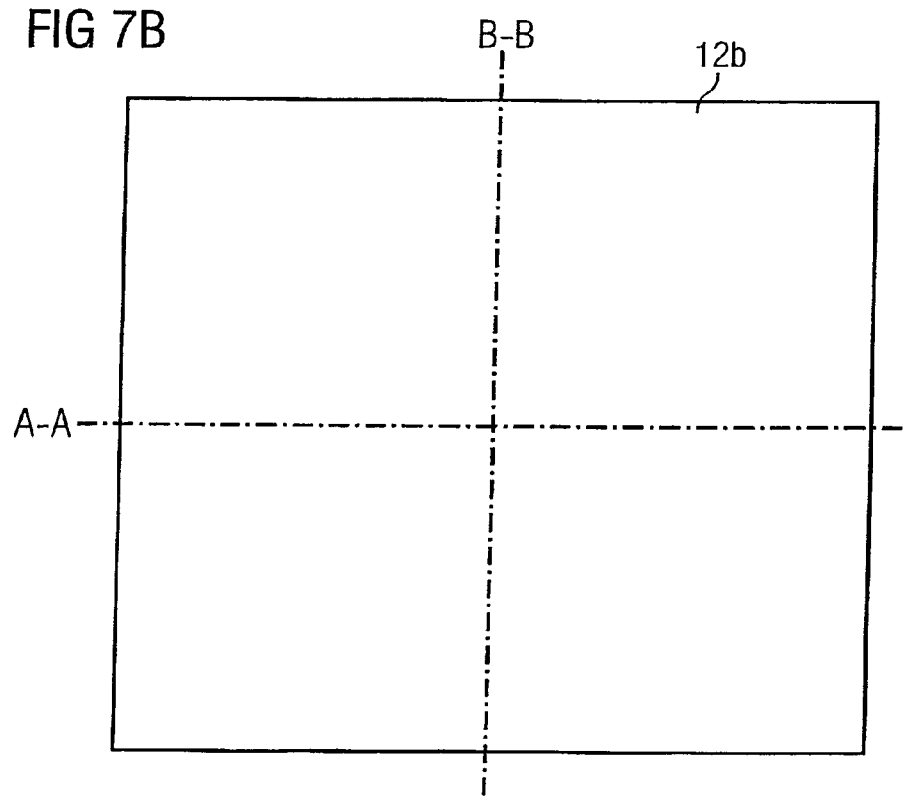
FIG 7B

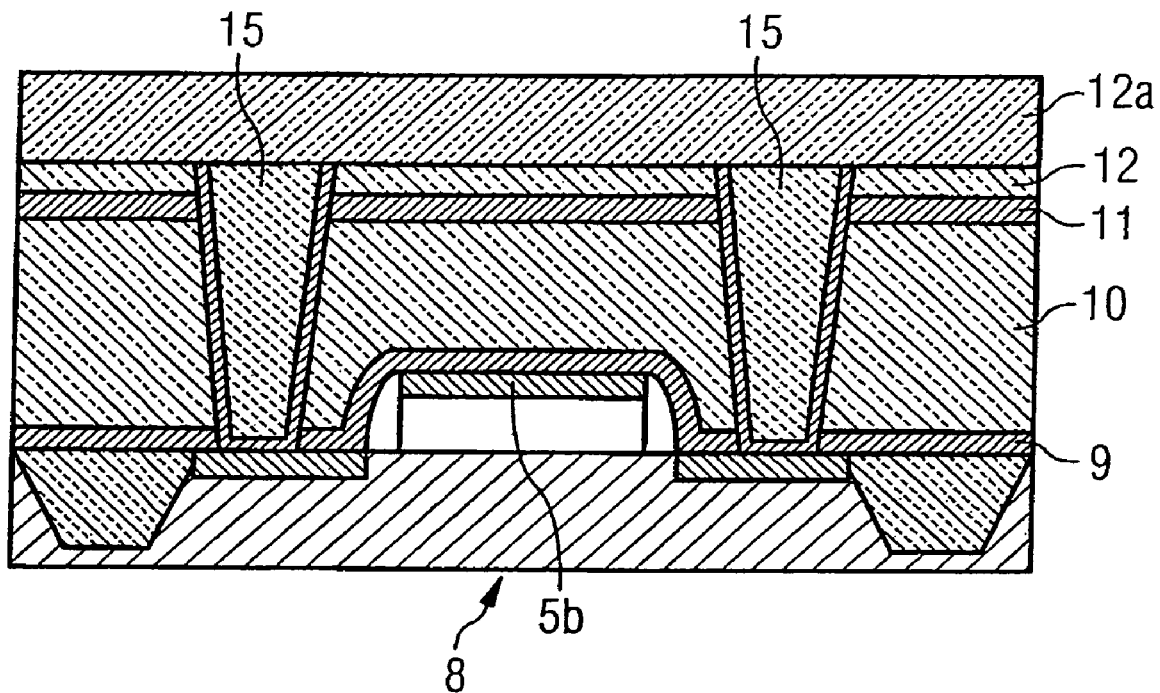

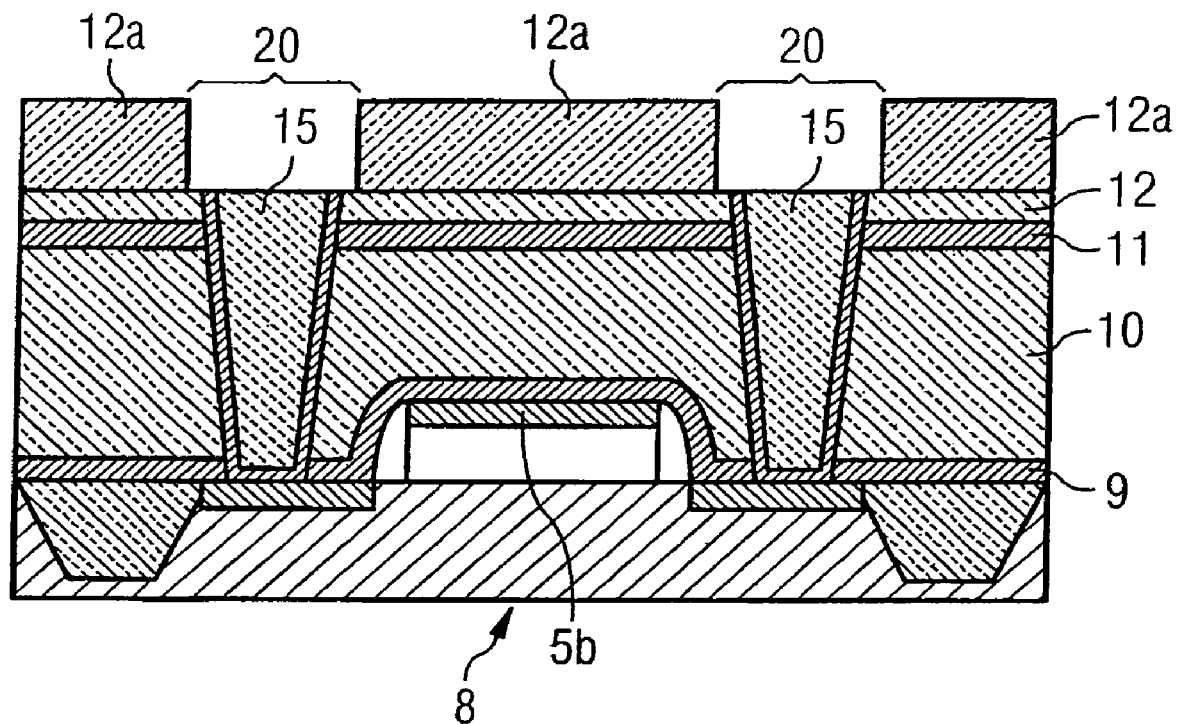
FIG 8C  A-A

FIG 9A  B-B
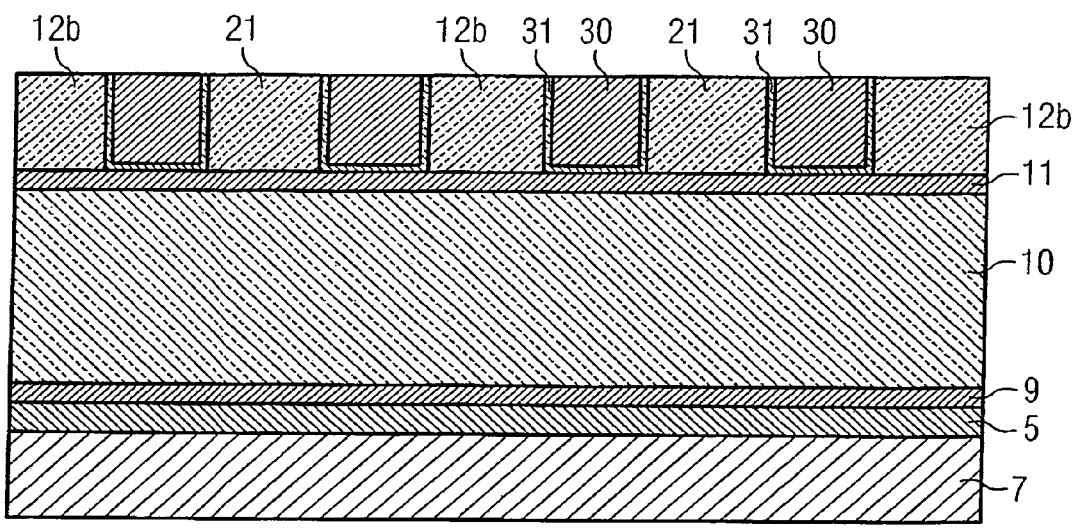
FIG 9B
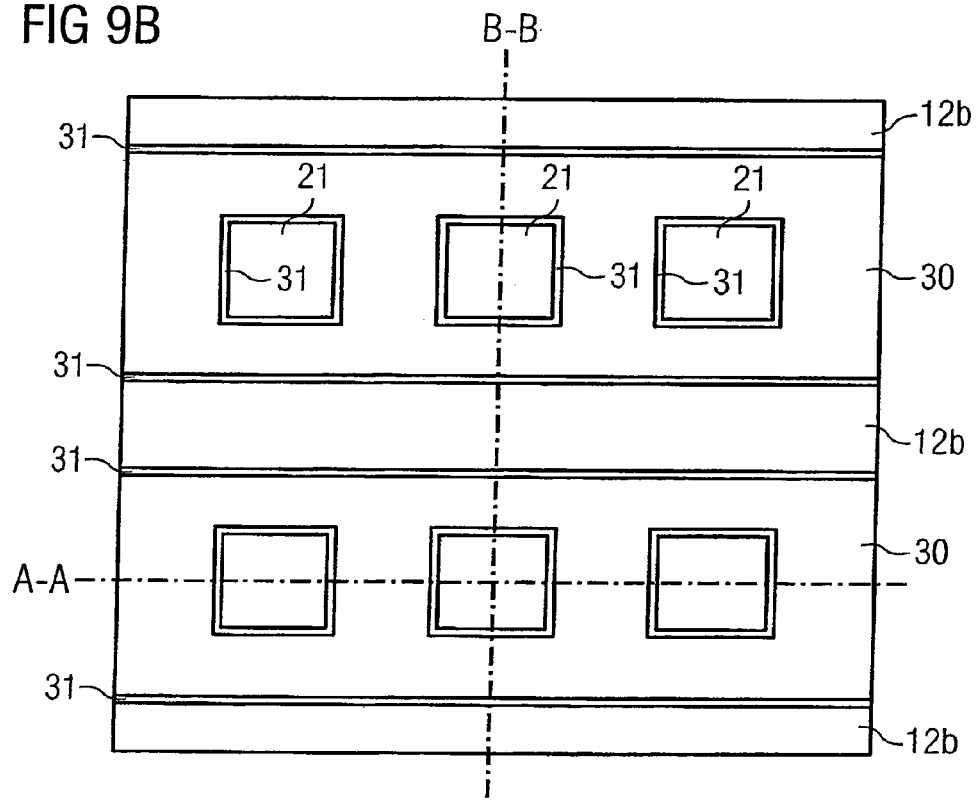

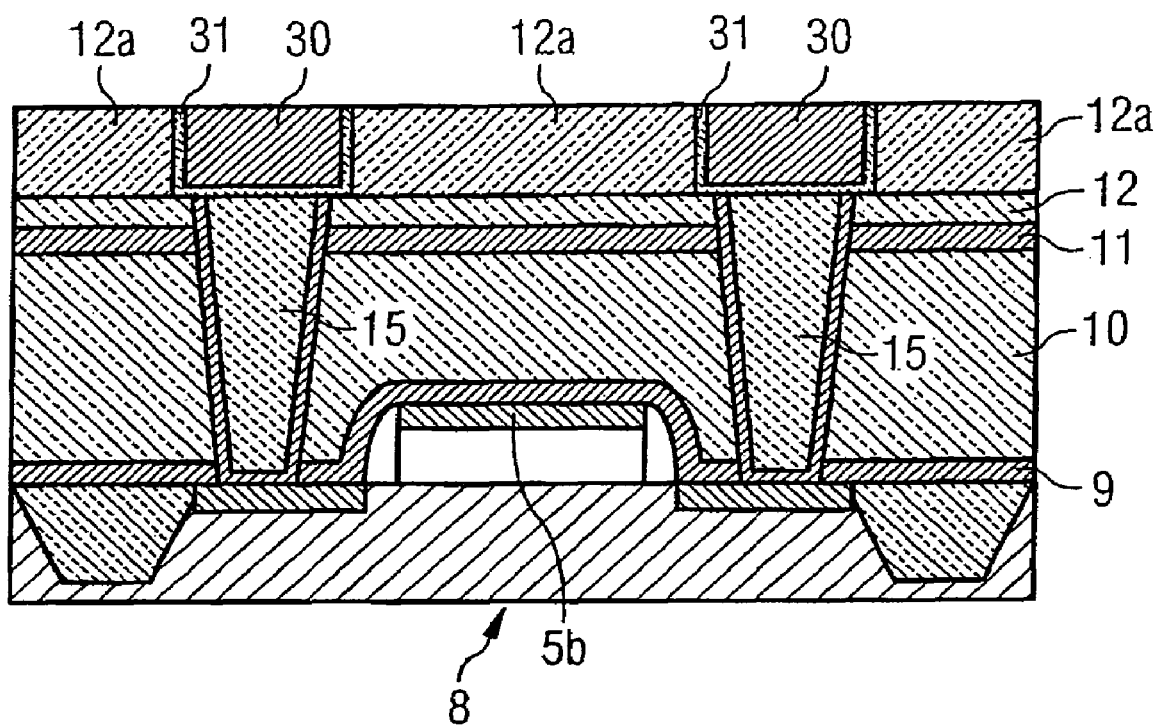
FIG 9C  A-A

FIG 10C A-A
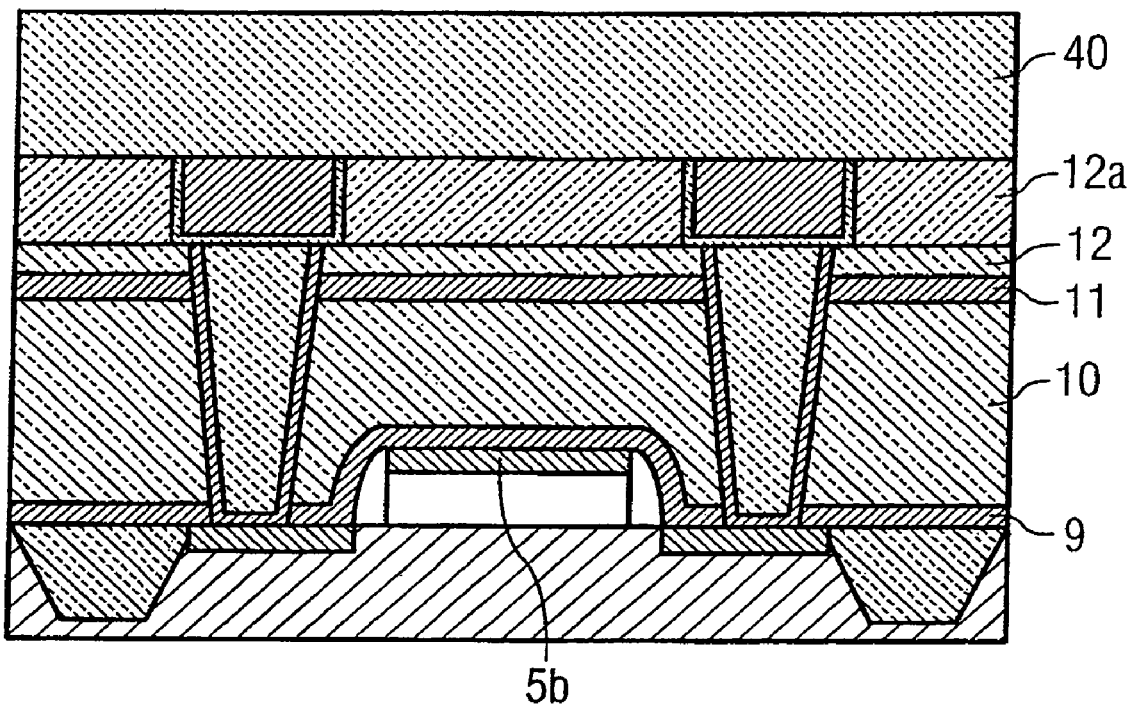
FIG 10D A-A
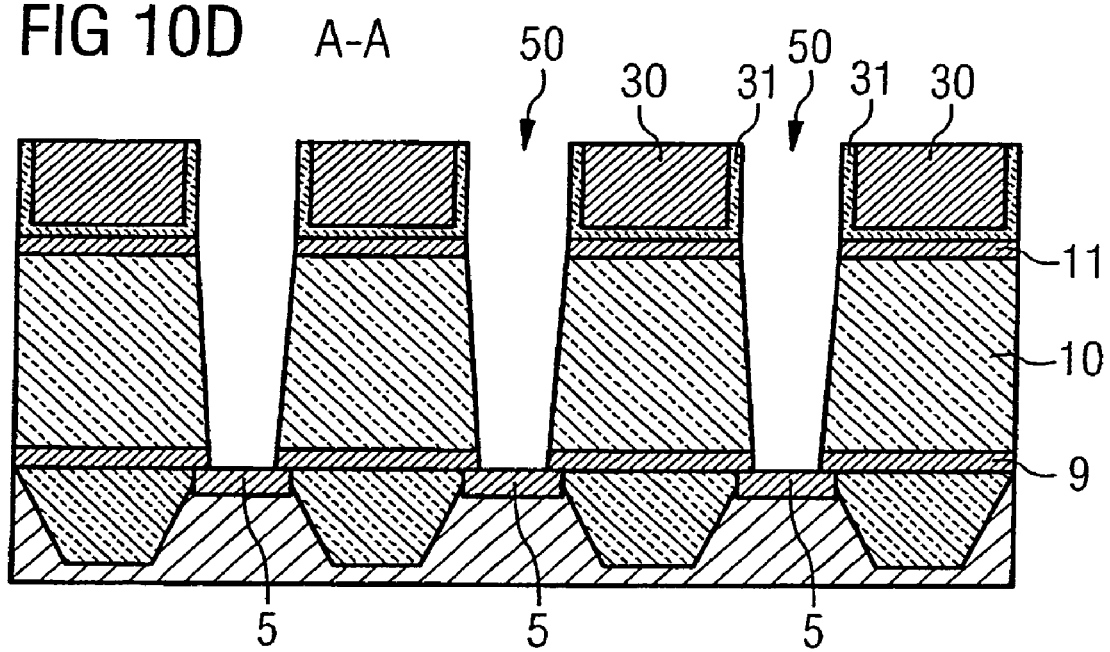

A-A

A-A

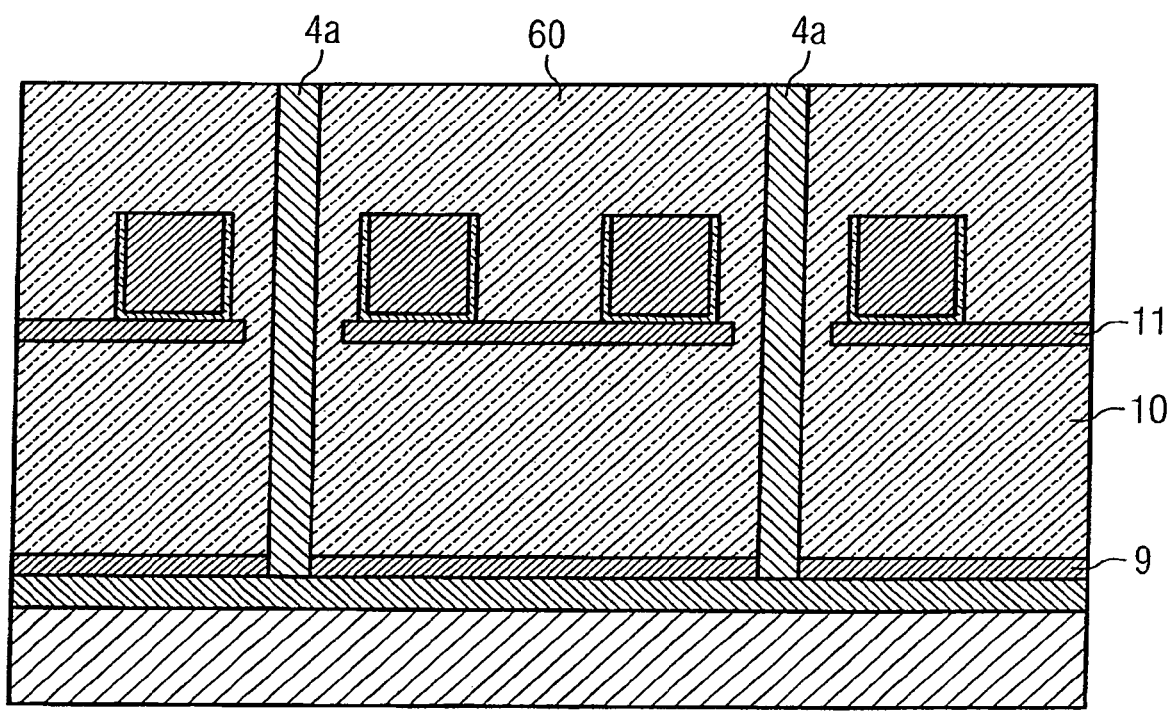
FIG 12C B-B

MEMORY DEVICE, IN PARTICULAR PHASE CHANGE RANDOM ACCESS MEMORY DEVICE WITH TRANSISTOR, AND METHOD FOR FABRICATING A MEMORY DEVICE

BACKGROUND

The invention relates to a memory device, in particular to a resistively switching memory device such as a Phase Change Random Access Memory ("PCRAM"), with a transistor. Further, the invention relates to a method for fabricating a memory device.

FIELD OF THE INVENTION

In the case of conventional memory devices, in particular conventional semiconductor memory devices, one differentiates between functional memory devices (e.g., PLAs, PALs, etc.), and table memory devices, e.g., ROM devices (ROM=Read Only Memory—in particular PROMs, EPROMs, EEPROMs, flash memories, etc.), and RAM devices (RAM=Random Access Memory—in particular e.g., DRAMs and SRAMs).

A RAM device is a memory for storing data under a predetermined address and for reading out the data under this address later. In the case of SRAMs (SRAM=Static Random Access Memory), the individual memory cells consist e.g., of few, for instance 6, transistors, and in the case of DRAMs (DRAM=Dynamic Random Access Memory) in general only of one single, correspondingly controlled capacitive element.

Furthermore, "resistive" or "resistively switching" memory devices have also become known recently, e.g., Phase Change Random Access Memories ("PCRAMs"), Conductive Bridging Random Access Memories ("CBRAMs"), etc.

In the case of "resistive" or "resistively switching" memory devices, an "active" or "switching active" material—which is, for instance, positioned between two appropriate electrodes—is placed, by appropriate switching processes, in a more or less conductive state (wherein e.g., the more conductive state corresponds to a stored logic "One", and the less conductive state to a stored logic "Zero", or vice versa).

In the case of Phase Change Random Access Memories (PCRAMs), for instance, an appropriate chalcogenide or chalcogenide compound material may be used as a "switching active" material (e.g., a Ge—Sb—Te ("GST") or an Ag—In—Sb—Te compound material, etc.). The chalcogenide compound material is adapted to be placed in an amorphous, i.e. a relatively weakly conductive, or a crystalline, i.e. a relatively strongly conductive state by appropriate switching processes (wherein e.g., the relatively strongly conductive state may correspond to a stored logic "One", and the relatively weakly conductive state may correspond to a stored logic "Zero", or vice versa). Phase change memory cells are, for instance, known from G. Wicker, "Nonvolatile, High Density, High Performance Phase Change Memory", SPIE Conference on Electronics and Structures for MEMS, Vol. 3891, Queensland, 2, 1999, and e.g., from Y. N. Hwang et al., "Completely CMOS Compatible Phase Change Nonvolatile RAM Using NMOS Cell Transistors", IEEE Proceedings of the Nonvolatile Semiconductor Memory Workshop, Monterey, 91, 2003, S. Lai et al., "OUM-a 180 nm nonvolatile memory cell element technology for stand alone and embedded applications", IEDM 2001, Y. Ha et al., "An edge contact type cell for phase change RAM featuring very low power consumption", VLSI 2003, H. Horii et al., "A novel cell technology using N-doped GeSbTe films for phase change RAM", VLSI 2003, Y. Hwang et al., "Full integration and reliability evaluation of phase-change RAM based on 0.24 µm-CMOS technologies", VLSI 2003, and S. Ahn et al., "Highly Manufacturable High Density Phase Change Memory of 64 Mb and beyond", IEDM 2004, etc.

In the case of the above Conductive Bridging Random Access Memories (CBRAMs), the storing of data is performed by use of a switching mechanism based on the statistical bridging of multiple metal rich precipitates in the "switching active" material. Upon application of a write pulse (positive pulse) to two respective electrodes in contact with the "switching active" material, the precipitates grow in density until they eventually touch each other, forming a conductive bridge through the "switching active" material, which results in a high-conductive state of the respective CBRAM memory cell. By applying a negative pulse to the respective electrodes, this process can be reversed, hence switching the CBRAM memory cell back in its low-conductive state. Such memory components are e.g., disclosed in Y. Hirose, H. Hirose, J. Appl. Phys. 47, 2767 (1975), T. Kawaguchi et. al., "Optical, electrical and structural properties of amorphous Ag—Ge—S and Ag—Ge—Se films and comparison of photoinduced and thermally induced phenomena of both systems", J. Appl. Phys. 79 (12), 9096, 1996, M. Kawasaki et. al., "Ionic conductivity of Agx(GeSe3)1−x (0<x0.571) glasses", Solid State Ionics 123, 259, 1999, etc.

Correspondingly similar as is the case for the above PCRAMs, for CBRAM memory cells an appropriate chalcogenide or chalcogenid compound (for instance GeSe, GeS, AgSe, CuS, etc.) may be used as "switching active" material.

In the case of PCRAMs, in order to achieve, with a corresponding PCRAM memory cell, a change from the above-mentioned amorphous, i.e. a relatively weakly conductive state of the switching active material, to the above-mentioned crystalline, i.e. a relatively strongly conductive state of the switching active material, an appropriate relatively high heating current pulse has to be applied to the electrodes, said heating current pulse resulting in that the switching active material is heated beyond the crystallization temperature and crystallizes ("writing process").

Vice versa, a change of state of the switching active material from the crystalline, i.e. a relatively strongly conductive state, to the amorphous, i.e. a relatively weakly conductive state, may, for instance, be achieved in that—again by means of an appropriate (relatively high) heating current pulse—the switching active material is heated beyond the melting temperature and is subsequently "quenched" to an amorphous state by quick cooling ("erasing process").

Typically, the above erase or write heating current pulses are provided via respective source lines and bit lines, and respective FET or bipolar access transistors associated with the respective memory cells, and controlled via respective word lines.

As as said above relatively high erase or write heating current pulses might be needed, relatively large (wide) access transistors are necessary, resulting in relatively large memory devices.

For these or other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1a illustrates a schematic cross-sectional view of a memory array region of a partially fabricated memory device in accordance with an embodiment of the present invention.

FIG. 1b illustrates a top view of the memory device illustrated in FIG. 1a.

FIG. 2a illustrates a schematic cross-sectional view of a memory array region of a partially fabricated memory device in accordance with an embodiment of the present invention.

FIG. 2b illustrates a schematic cross-sectional view of a memory array region of a partially fabricated memory device in accordance with an embodiment of the present invention.

FIG. 2c illustrates a top view of the memory device illustrated in FIG. 2b.

FIG. 3a illustrates a schematic cross-sectional view of a memory array region of a partially fabricated memory device in accordance with an embodiment of the present invention.

FIG. 3b illustrates a top view of the memory device illustrated in FIG. 3a.

FIG. 3c illustrates a schematic cross-sectional view of a peripheral region of the memory device illustrated in FIG. 3a.

FIG. 4a illustrates a schematic cross-sectional view of a memory array region of a partially fabricated memory device in accordance with an embodiment of the present invention.

FIG. 4b illustrates a top view of the memory device illustrated in FIG. 4a.

FIG. 4c illustrates a schematic cross-sectional view of a peripheral region of the memory device illustrated in FIG. 4a.

FIG. 5a illustrates a schematic cross-sectional view of a memory array region of a partially fabricated memory device in accordance with an embodiment of the present invention.

FIG. 5b illustrates a top view of the memory device illustrated in FIG. 5a.

FIG. 5c illustrates a schematic cross-sectional view of a peripheral region of the memory device illustrated in FIG. 5a.

FIG. 6 illustrates a schematic cross-sectional view of a peripheral region of a partially fabricated memory device in accordance with an embodiment of the present invention.

FIG. 7a illustrates a schematic cross-sectional view of a memory array region of a partially fabricated memory device in accordance with an embodiment of the present invention.

FIG. 7b illustrates a top view of the memory device illustrated in FIG. 7a.

FIG. 7c illustrates a schematic cross-sectional view of a peripheral region of the memory device illustrated in FIG. 7a.

FIG. 8b illustrates a top view of the memory device illustrated in FIG. 8a.

FIG. 8c illustrates a schematic cross-sectional view of a peripheral region of the memory device illustrated in FIG. 8a.

FIG. 9a illustrates a schematic cross-sectional view of a memory array region of a partially fabricated memory device in accordance with an embodiment of the present invention.

FIG. 9b illustrates a top view of the memory device illustrated in FIG. 9a.

FIG. 9c illustrates a schematic cross-sectional view of a peripheral region of the memory device illustrated in FIG. 9a.

FIG. 10b illustrates a top view of the memory device illustrated in FIG. 10a.

FIG. 10c illustrates a schematic cross-sectional view of a peripheral region of the memory device illustrated in FIG. 10a.

FIG. 10d illustrates a schematic cross-sectional view of the memory array region of the memory device illustrated in FIG. 10a.

FIG. 11b illustrates a top view of the memory device illustrated in FIG. 1a.

FIG. 12b illustrates a top view of the memory device illustrated in FIG. 12a.

FIG. 12c illustrates a schematic cross-sectional view of the memory array region of the memory device illustrated in FIG. 12a.

SUMMARY

Figure 8A:
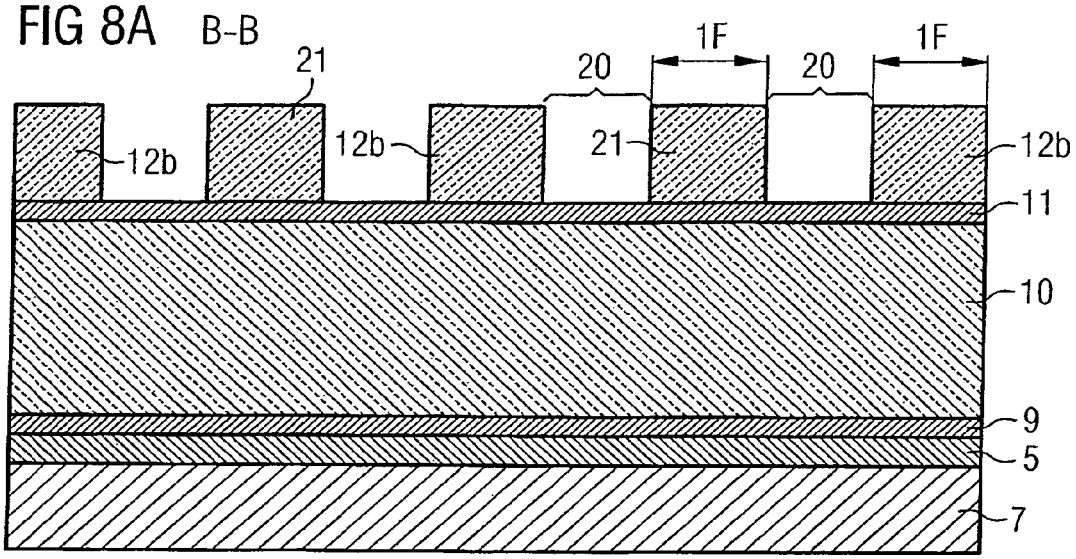
FIG. 8a illustrates a schematic cross-sectional view of a memory array region of a partially fabricated memory device in accordance with an embodiment of the present invention.

The present invention provides a memory device having at least one nanowire or nanotube or nanofibre access transistor. In one embodiment, the nanowire or nanotube or nanofibre access transistor directly contacts a switching active material of the memory device. According to an additional aspect, a memory device includes at least one nanowire or nanotube or nanofibre transistor with a vertically arranged nanowire or nanotube or nanofibre. In one embodiment, the memory device is a resistively switching memory device, e.g., a Phase Change Random Access Memory, or a Conductive Bridging Random Access Memory.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or other changes may be made without departing from the scope of the present invention. The following detailed description, therefore, is not to be taken in a limiting sense, and the scope of the present invention is defined by the appended claims.

FIG. 1a illustrates a schematic cross-sectional view of a memory array region of a partially fabricated memory device 1 in accordance with an embodiment of the present invention.

The memory device 1 preferably is a "resistive" or "resistively switching" memory device, in particular, a Phase Change Random Access Memory ("PCRAM") device.

The "resistively switching" memory device 1 as conventional "resistively switching" memory devices comprises an "active" or "switching active" material 2 which by appropriate switching processes is placed in a more or less conductive state (wherein e.g., the more conductive state corresponds to a stored logic "One", and the less conductive state to a stored logic "Zero", or vice versa).

As a "switching active" material 2, for instance, an appropriate chalcogenide or chalcogenide compound material may be used (here: e.g., a Ge—Sb—Te ("GST") compound material (or e.g., an Ag—In—Sb—Te compound material, etc.)). The chalcogenide compound material is adapted to be placed in an amorphous, i.e. a relatively weakly conductive, or a crystalline, i.e. a relatively strongly conductive state.

As is illustrated in FIG. 1, and as will be described in further detail below, the "switching active" material 2 other than in conventional Phase Change Random Access Memory ("PCRAM") devices is not positioned between two respective electrodes, but between an electrode 3, and a nanowire transistor 4.

In order to achieve a change from the above-mentioned amorphous, i.e. a relatively weakly conductive state of the switching active material 2, to the above-mentioned crystalline, i.e. a relatively strongly conductive state of the switching active material 2, an appropriate heating current pulse is applied to the switching active material 2, said heating current pulse resulting in that the switching active material 2 is heated beyond the crystallization temperature and crystallizes ("writing process").

Vice versa, a change of state of the switching active material 2 from the crystalline, i.e. a relatively strongly conductive state, to the amorphous, i.e. a relatively weakly conductive state, may, for instance, be achieved in that—again by means of an appropriate heating current pulse—the switching active material 2 is heated beyond the melting temperature and is subsequently "quenched" to an amorphous state by quick cooling ("erasing process").

As will be described in further detail below, and as is illustrated in FIG. 1a, the above erase or write heating current pulses are provided via respective source lines 5, and via the above nanowire transistors 4 (in particular, respective n-p-n-doped regions 4a of the transistors 4) in direct contact with the switching active material 2.

From the switching active material 2, the respective erase or write heating current flows through the above electrodes 3 (also in direct contact with the switching active material 2), and respective bit lines (not shown) contacting the electrodes 3.

As also will be described in further detail below, the above n-p-n-doped regions 4a of the transistors 4 are surrounded by respective transistor gate regions 4b, additionally functioning as word lines.

The nanowire transistors 4 are built in a vertical direction. The nanowire transistors 4 function as "access transistors", and—due to the direct contact between the n-p-n-doped regions 4a, and the switching active material 2—additionally function as electrodes.

As is illustrated in FIG. 1b, the contact area between a respective n-p-n-doped region 4a, and a respective switching active material 2 is relatively small, leading to relatively high current density in the switching active material 2.

Whether or not a respective transistor 4 is in a conductive state (in which case a erase or write heating current pulse might flow from a respective source line 5 through a respective n-p-n-doped transistor region 4a to the associated switching active material 2) or a non-conductive state (preventing that a erase or write heating current pulse might flow from a respective source line 5 through a respective n-p-n-doped transistor region 4a to the associated switching active material 2) is determined by the state of the above word lines/transistor gate regions 4b.

As illustrated in FIG. 1b (and e.g., also in FIG. 2c), the above source lines 5 (and e.g., also the above bit lines contacting the electrodes 3) run through the memory device 1 in a direction A perpendicular to a direction B in which the word lines 4b run through the memory device 1.

Hence, a respective switching active material 2 might be selected for writing/erasing by activating the respective word line 4b associated therewith, and applying a erase or write heating current pulse to the respective source line 5.

Referring again to FIG. 1a, the source lines 5 are isolated from one another by respective STI-regions 6 (STI=Shallow Trench Isolation).

For the above electrodes 3, e.g., TiN may be used, or e.g., W, Ti, Ta, or e.g., Cu, Ag, Au, Zn, etc., or e.g., WN, TaN, NbN, ZrN, HfN, or e.g., TiSiN, TaSiN, TiAlN, etc., or any other suitable material.

Associated pairs of switching active material 2/electrodes 3 are isolated from neighboring pairs of switching active material 2/electrodes 3 by a suitable isolating material, e.g., SiO2 (not shown).

In the following, an example of a process for fabricating the memory device 1 illustrated in FIGS. 1a and 1b is described in more detail.

As illustrated in FIG. 2a, and as is the case in conventional Phase Change Random Access Memory ("PCRAM") devices, the above STI-regions 6 are built in a respective silicon substrate 7. The STI-regions 6 both are built in a memory array region of the memory device 1 (illustrated in FIG. 2a), as in a peripheral region of the memory device 1 (not shown).

As is illustrated in FIG. 2c, the STI-regions 6 extend in the above direction A, i.e., parallel to the source lines 5 (built after the STI-regions 6, see description below).

After building the STI-regions 6, and as is the case in conventional Phase Change Random Access Memory ("PCRAM") devices, in the above peripheral region of the memory device 1, respective transistors 8 for controlling e.g., the above word lines 4b, and/or the above source lines 5 (or more exactly: parts of the respective transistors 8) might be built.

Thereafter, as is illustrated in FIG. 2b, by use of a respective salicidation process, and also as is the case in conventional Phase Change Random Access Memory ("PCRAM") devices, in the above memory array region of the memory device 1, the above source lines 5 might be built (as well as e.g., corresponding sources/drains, and gates in the above peripheral region of the memory device 1, e.g., sources/drains 5a, and gates 5b of the above peripheral transistors 8). In the course of the above salicidation process, a respective self aligned silicidation takes place, leading to a reaction of e.g., cobalt (or e.g., nickel, titanium, etc.) with the silicon provided in the above substrate 7, whereby e.g., the above source lines 5 (and the above sources/drains 5a, and gates 5b) are formed. Optionally, thereafter, parts of the areas subject to the above salicidation process (e.g., areas where no contacts shall be fabricated) might be covered with a respective resist.

In a subsequent process, and as is illustrated in FIGS. 3a and 3c (and as is the case in conventional Phase Change Random Access Memory ("PCRAM") devices), both on the memory array region and the peripheral region of the memory device 1, corresponding isolation layers might be deposited, e.g., first a SiN layer 9, and then a SiO2 layer 10, covering e.g., the above source lines 5, and the STI-regions 6. Thereby, e.g., respective ILD (inter level dielectric) deposition processes might be applied. After depositing the above SiN and/or SiO2 layers 9, 10, a respective polishing might take place. The SiO2 layer 10 e.g., has a height of between 200 nm and 600 nm, e.g., between 300 nm and 500 nm, and the SiN layer 9 e.g., has a height of between 5 nm and 50 nm, e.g., between 10 nm and 30 nm.

After depositing the above SiN and SiO2 layers 9, 10, in a subsequent process, and as is illustrated in FIGS. 4a and 4c (and as is the case in conventional Phase Change Random Access Memory ("PCRAM") devices), both on the memory array region and the peripheral region of the memory device 1, a corresponding etch stop layer 11, and a further isolation layer 12 is deposited, e.g., first a SiC layer 11 as etch stop layer 11 (covering e.g., the above SiO2 layer 10), and then a SiO2 layer 12 as further isolation layer 12 (covering e.g., the above SiC layer 11). The SiC layer 11 e.g., has a height of between 5 nm and 50 nm, e.g., between 10 nm and 30 nm, and the SiO2 layer 12 e.g., has a height of between 100 nm and 400 nm, e.g., between 150 nm and 250 nm.

After depositing the above SiC and SiO2 layers 11, 12, in a subsequent process, and as is illustrated in FIG. 5c (and as is the case in conventional Phase Change Random Access Memory ("PCRAM") devices), in the peripheral region of the memory device 1 (but not in the memory array region, see FIGS. 5a and 5b) respective contact holes 13 are built, preferably by use of respective contact litho and etch processes, e.g., involving a 4-step etching, for instance a respective SiO2/SiC/SiO2/SiN-etching process. As illustrated in FIG. 5c, the contact holes 13 reach all through the above layers 9, 10, 11, 12, such that the above sources/drains 5a of the above peripheral transistors 8 are laid open.

In a subsequent process, and as is illustrated in FIG. 6 (and as is the case in conventional Phase Change Random Access Memory ("PCRAM") devices), in the peripheral region of the memory device 1, in the contact holes 13, a liner 14, e.g., Ti/TiN is deposited, contacting—in a downward direction—the above sources/drains 5a of the above peripheral transistors 8, as well as—in a sideward direction—the above layers 9, 10, 11, 12. Thereafter, as is also illustrated in FIG. 6, the contact holes 13 are filled with a respective filler material 15, e.g., tungsten. Afterwards, a respective polishing process is carried out, e.g., a respective CMP (chemical mechanical polishing) process.

After carrying out the polishing process, in a subsequent process, and as is illustrated in FIGS. 7a and 7c, both on the memory array region of the memory device 1 (here: on the above layer 12, illustrated e.g., in FIG. 5a) and the peripheral region of the memory device 1 (here: both on the above layer 12, and the filler material 15), a further SiO2 layer 12a is deposited. Thereby, the SiO2 layer 12 is increased in height to e.g., a SiO2 layer 12b with a (total) height of e.g., between 200 nm and 500 nm, e.g., between 250 nm and 350 nm (see e.g., FIG. 7a).

Figure 8B:
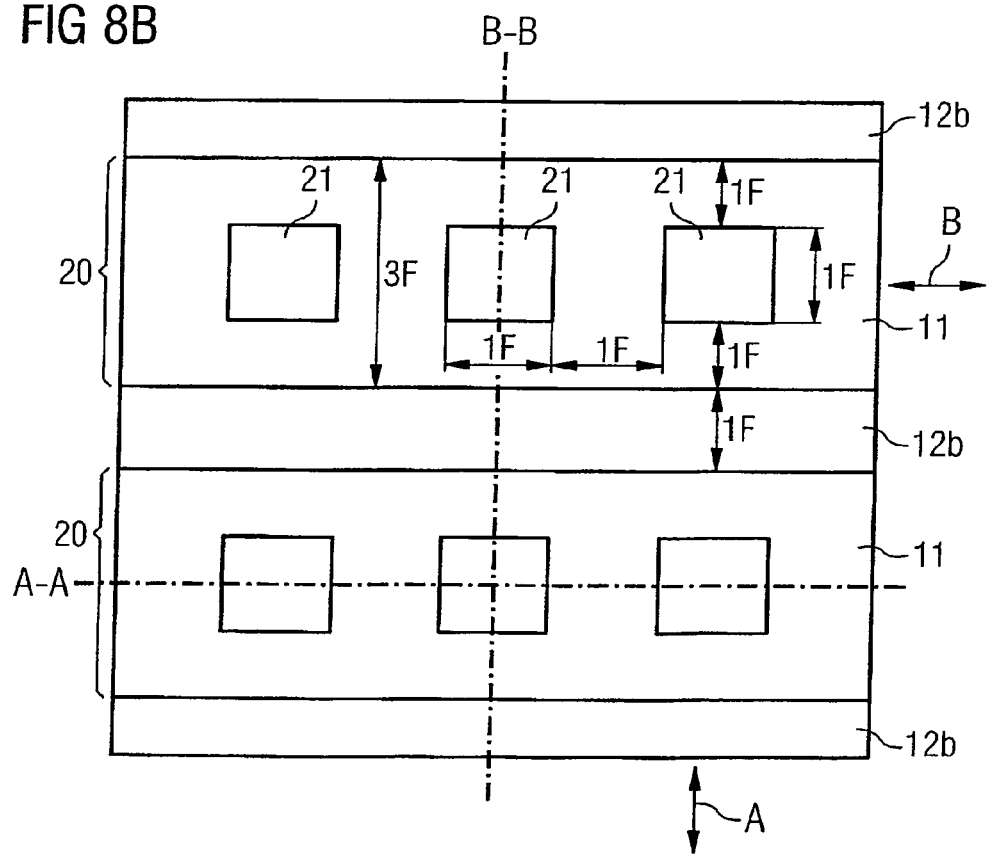

After depositing the above SiO2 layer 12a, 12b, in a subsequent process, and as is illustrated in FIGS. 8a, 8b, 8c, in the peripheral region of the memory device 1 (see FIG. 8c) and in the memory array region (see FIGS. 8a and 8b) respective regions 20 are etched, preferably by use of respective "metal 1" (=1st metal layer) litho and etch processes. Thereby, as is illustrated in FIG. 8c, in the peripheral region of the memory device 1, above the filler material 15 (and hence, above the sources/drains 5a of the peripheral transistors 8), respective trenches are built all through the above SiO2 layer 12a, such that the filler material 15 is laid open. Further, as is illustrated in FIGS. 8a, 8b, in the memory array region of the memory device 1, in regions 20 where the above word lines/transistor gate regions 4b are to be built later (see e.g., FIG. 1a), the above SiO2 layer 12b is etched, such that the above etch stop layer 11 (here e.g., the above SiC layer 11) is laid open.

As can be seen from FIG. 8b, the regions 20 etched in the memory array region—just as the word lines/transistor gate regions 4b to be built later—extend in the above direction B all through the memory array region, i.e., perpendicular to the above direction A in which the source lines 5 run through the memory device 1. Further, adjacent regions 20 etched in the memory array region—just as adjacent word lines/transistor gate regions 4b to be built later—run parallel to each other.

The regions 20 etched in the memory array region—just as the word lines/transistor gate regions 4b to be built later—may have a width of e.g., about 3 F (whereby F represents the minimal structural size, for instance between 40 nm and 80 nm, e.g., between 50 nm and 70 nm, e.g., 65 nm). The distance between two adjacent regions 20 etched in the memory array region—just as the distance between two adjacent word lines/transistor gate regions 4b to be built later—may e.g., be about 1 F.

As can be seen from FIG. 8a and FIG. 8b, when carrying out the above metal 1 litho and etch processes, regions 21 directly above the source lines 5—more particular, regions 21 where the above transistors 4 (more specifically the n-p-n-doped transistor regions 4a, see FIG. 1a) are to built later—are left standing. The regions 21 may e.g., have a substantially rectangular or square cross-section, and e.g., may have a width and length of e.g., about 1 F. Further, the distance between adjacent regions 21 may e.g., also be about 1 F.

After carrying out the above metal 1 litho and etch processes, in a subsequent process, and as is illustrated in FIGS. 9a, 9b, 9c, in the peripheral region of the memory device 1 (see FIG. 9c) and in the memory array region (see FIGS. 9a and 9b) the etched regions 20 (see FIGS. 8a, 8b, 8c) are filled. For this purpose, first, a TaN/Ta barrier 31 is deposited in the etched regions 20 (e.g., in the peripheral region of the memory device 1, on the surface of the filler material 15, and on side walls of the layer 12a (see FIG. 9c), and in the memory array region, on the surface of the layer 11, and on side walls of the layer 12b/the above regions 21 (see FIG. 9a)). Thereafter, —e.g., by use of a respective sputtering process—Cu seeds are deposited on the surface of the TaN/Ta barrier 31. Afterwards, a respective metal 30, e.g., Cu is deposited electrochemically, for instance, by carrying out a respective Cu plating process. Thereby, the above etched regions 20 are completely filled with the above metal 30 (here: Cu). Finally, a respective polishing process is carried out, e.g., a CMP (chemical mechanical polishing) process. Summarized, for building the above word lines/gate regions 4b having the above metal 30, as explained above with respect to FIGS. 7a-9c, a "damascene" process is carried out.

Figure 10A:
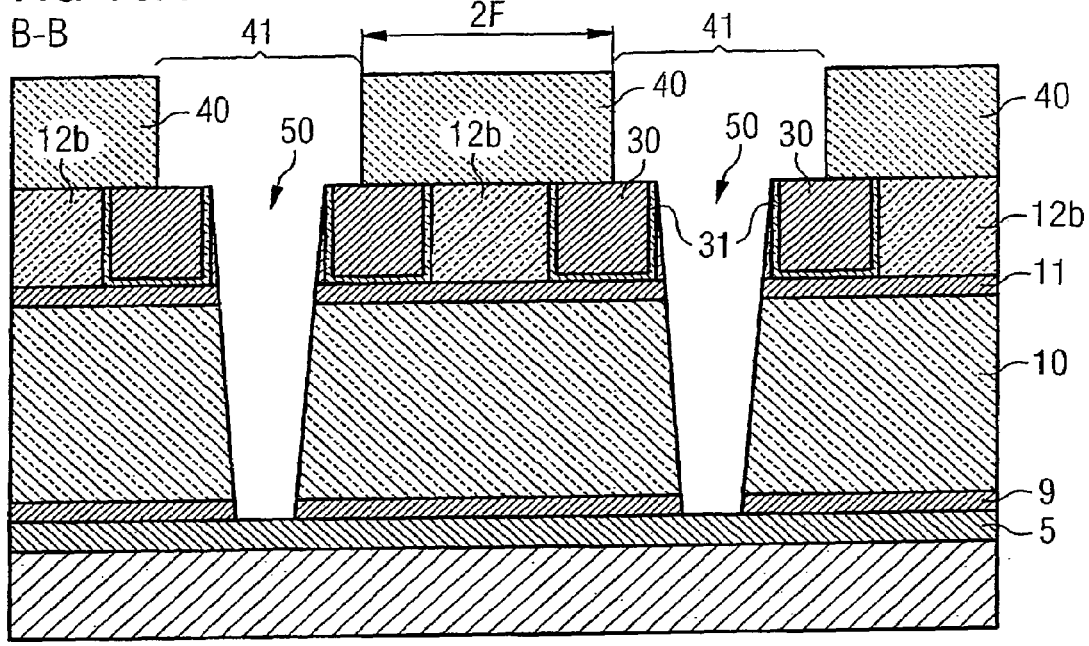
FIG. 10a illustrates a schematic cross-sectional view of a memory array region of a partially fabricated memory device in accordance with an embodiment of the present invention.
Figure 10B:
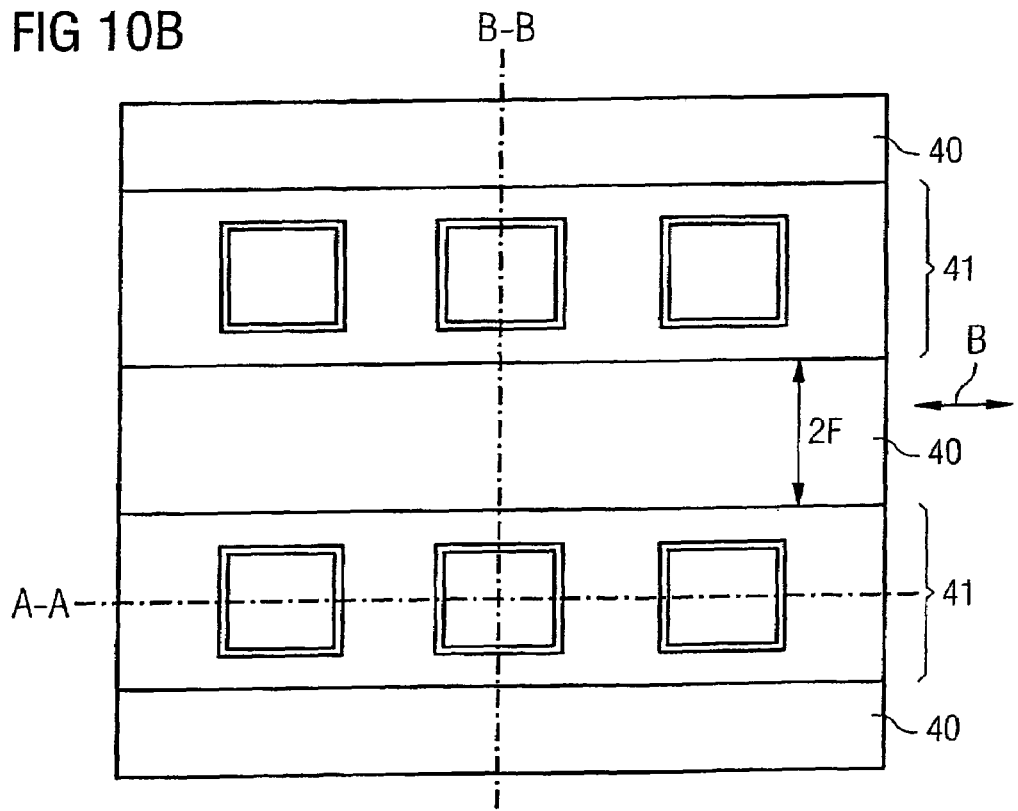

Thereafter, in a subsequent process, and as is illustrated in FIGS. 10a, 10b, 10c, 10d a respective litho and etch process is carried out. For this purpose, in a first process, both the peripheral region of the memory device 1 (see FIG. 10c) and the memory array region of the memory device 1 (see FIGS. 10a, 10b) are covered with a respective resist 40. Thereafter, the resist 40—in parts of the memory array region (see below), but not in the peripheral region—is irradiated (e.g., exposed to light), and developed, such that the resist 40 in irradiated (exposed) regions 41 may be removed. As is illustrated in FIG. 10b, the remaining—non-removed—resist 40 in the memory array region has the form of stripes extending in the above direction B all through the memory array region (parallel to the word lines/transistor gate regions 4b, and perpendicular to the above direction A in which the source lines 5 run through the memory device 1). As is illustrated in FIG. 10b, the stripes of the remaining resist 40 in the memory array region e.g., may have a width of e.g., about 2 F. Further, as is illustrated in FIGS. 10b and 10d, the longitudinal middle axis of the above irradiated regions 41 where the resist 40 is removed is centered on the longitudinal middle axis of the above regions 21, illustrated in FIGS. 8a, 8b, which were left standing when carrying out the above metal 1 litho and etch processes described in connection with FIGS. 8a, 8b (i.e., is centered with regard to the longitudinal middle axis of the regions 21 where the above n-p-n-doped transistor regions 4a, see FIG. 1a are to built later).

Afterwards, as is illustrated in FIGS. 10a, 10b, 10d, in the memory array region of the memory device 1 (but not in the peripheral region, see FIG. 10c) respective contact holes 50 are built, preferably—correspondingly similar to the processes used for building the above contact holes 13 in the peripheral region, and as described with respect to FIG. 5c—by use of a respective 4-step etching, for instance a respective SiO2/SiC/SiO2/SiN-etching process. As illustrated in FIGS. 10a, 10b, 10d the contact holes 50 reach all through the above layers 9, 10, 11, 12b (more particularly: the above regions 21 left standing)—however, not through the above metal 30, as the above copper metal and TaN/Ta barrier 31 prevents etching thereof—such that the above source lines 5 partly are laid open. Hence, an etching is performed which is self-aligned with respect to the above 1st metal layer, here: the transistor gate regions/word lines 4b.

After carrying out the above 4-step etching, the (remaining) resist 40 is removed in both the memory array region and the peripheral region of the memory device 1.

Figure 11A:
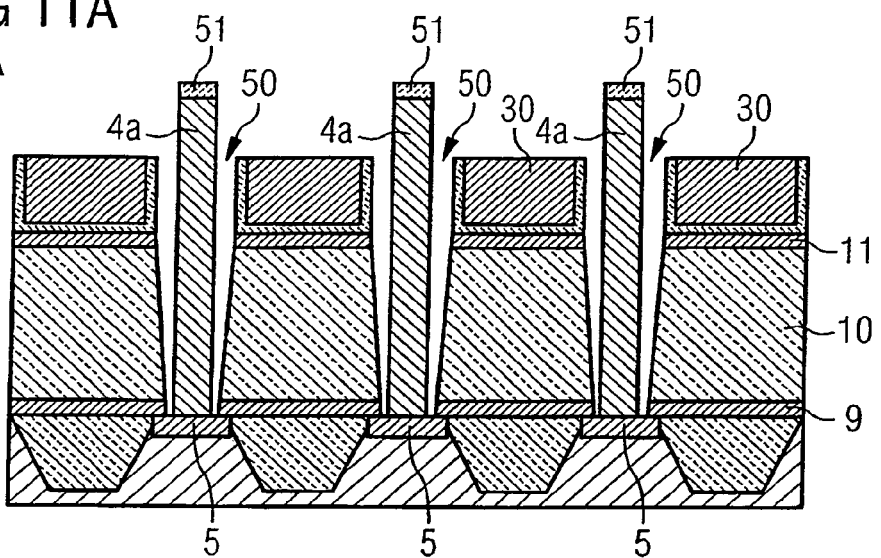
FIG. 11a illustrates a schematic cross-sectional view of a memory array region of a partially fabricated memory device in accordance with an embodiment of the present invention.
Figure 11B:
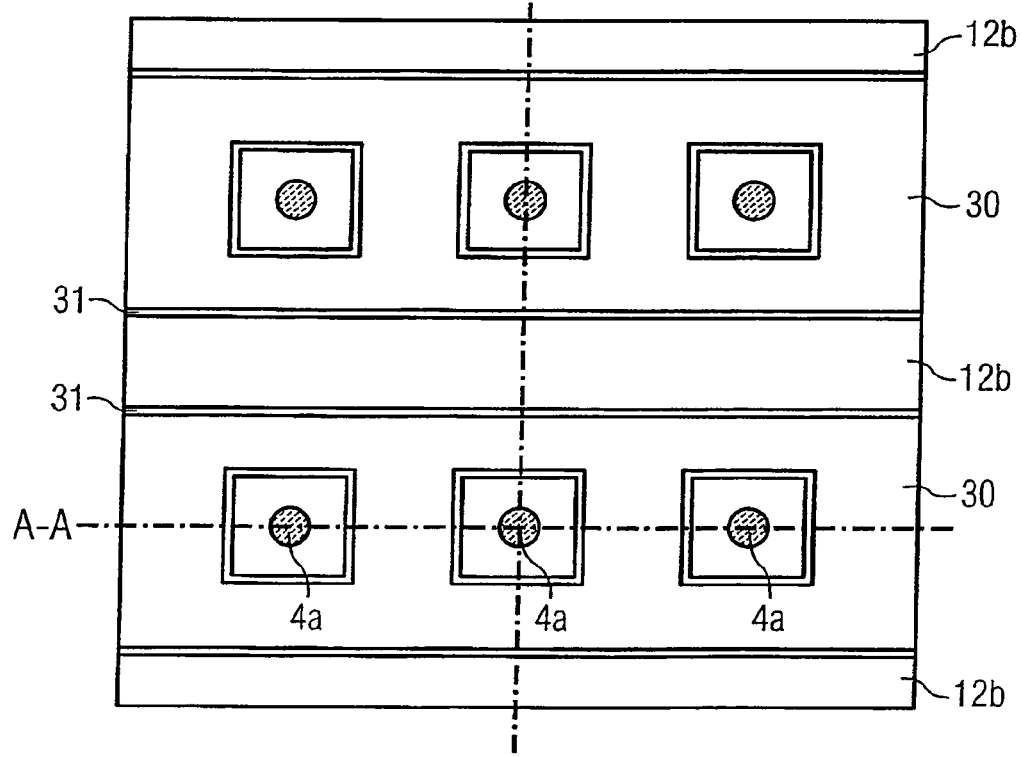

Thereafter, as is illustrated in FIGS. 11a, 11b the above (nanowire) n-p-n-doped transistor regions 4a are built in the above contact holes 50. For this purpose, in a first process, a catalyst 51 is deposited on the surface of the laid open, exposed parts of the source lines 5, e.g., by use of a respective electroless deposition process. The catalyst 51 e.g., primarily might comprise a respective silicide forming metal such as e.g., Ti, Pd, Pt, Au, Cu, Co, Cr, Hf, Ir, Mn, Mo, Ni, Rh, Ta, W, Zr, etc. Afterwards, the catalyst 51 deposited on the surface of the (laid open, exposed) parts of the source lines 5 might be heated, such that its area is reduced by coagulation. Thereby, as becomes clear from the description below, the contact area between the yet-to-be-built n-p-n-doped transistor regions 4a, and the switching active material 2 (also to be built later) might be further reduced, additionally enhancing the current density in the switching active material 2.

Afterwards, using the above catalyst 51, a respective nanowire/nanotube/nanofibre is grown in the contact holes 50 (e.g., a respective Si nanowire, as e.g., described in Cui, Y.; Duan, X.; Hu, J.; Lieber, C. M.: J. Phys. Chem. B 2000, 103, 5213, or any other suitable nanowire/nanotube/nanofibre, e.g., a respective carbon nanowire/nanotube/nanofibre, etc.), so as to finally form the above n-p-n-doped transistor regions 4a. As can be seen in FIG. 11a, the catalyst 51 (not illustrated in FIG. 11b) whilst the respective nanowire/nanotube/nanofibre is growing keeps staying on top of it. As is further illustrated in FIG. 11a, an empty space is left between the nanowire/nanotube/nanofibre, and the above layers 9, 10, 11/the above barrier 31. Further—as is illustrated in FIG. 11b—the nanowire/nanotube/nanofibre may have a cross-section which is substantially circular. The diameter of the nanowire/nanotube/nanofibre may be relatively small, e.g., below 1 F, for instance between 0.1 F and 1 F, e.g., between 0.2 F and 0.5 F, etc.

According to FIG. 11a, a bottom section of the nanowire/nanotube/nanofibre may be n-doped (or alternatively: p-doped), a middle section of the nanowire/nanotube/nanofibre may be p-doped (or alternatively: n-doped), and an upper section of the nanowire/nanotube/nanofibre may again be n-doped (or alternatively: p-doped). The respective doping of the nanowire/nanotube/nanofibre may be achieved by e.g., adding respective gases into the atmosphere during the growth of the nanowire/nanotube/nanofibre. For instance, whilst growing the above bottom section of the nanowire/nanotube/nanofibre, e.g., PH3 may be added to the atmosphere so as to achieve a respective n-doping of the bottom section of the nanowire/nanotube/nanofibre. Further, whilst growing the above middle section of the nanowire/nanotube/nanofibre, e.g., B2H6 may be added to the atmosphere so as to achieve a respective p-doping of the middle section of the nanowire/nanotube/nanofibre. Finally, whilst growing the above upper section of the nanowire/nanotube/nanofibre, e.g., again PH3 may be added to the atmosphere so as to achieve a respective n-doping of the upper section of the nanowire/nanotube/nanofibre.

Figure 12A:
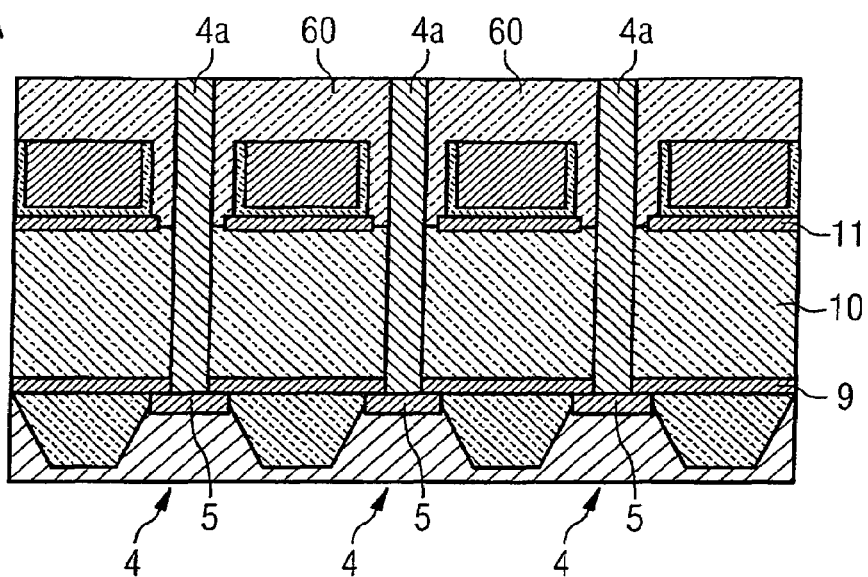
FIG. 12a illustrates a schematic cross-sectional view of a memory array region of a partially fabricated memory device in accordance with an embodiment of the present invention.
Figure 12B:
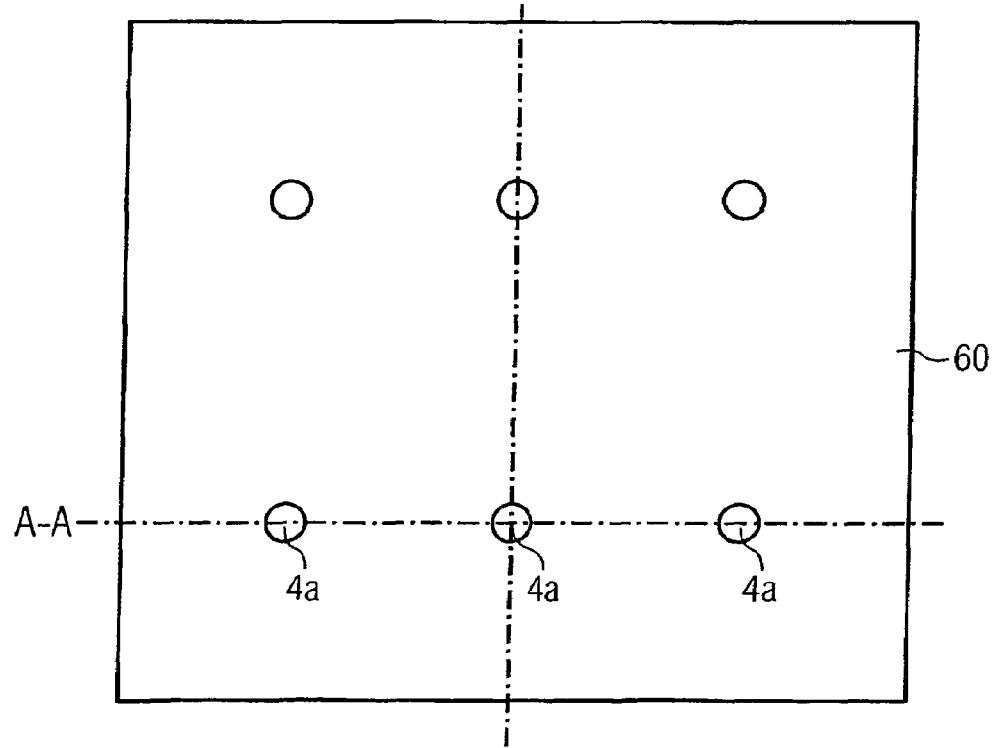

After building the nanowire/nanotube/nanofibre, and as is illustrated in FIGS. 12a, 12b, 12c, the gate-oxide of the transistors 4 is formed, e.g., by conformly depositing SiO2 i) in the above empty space between the nanowire/nanotube/nanofibre, and the layers 9, 10, 11/the barrier 31, and ii) above the metal 30 (here: Cu)/above the barrier 31 (see e.g., the SiO2 layer 60 illustrated in FIGS. 12a, 12b, 12c). Thereby (in particular for the above process i)), e.g., a respective thermal SiO2 deposition process might be used, and/or (in particular for the above process ii)) e.g., a respective CVD (chemical vapor deposition) or ALD (atomic layer deposition) process, etc. Thereafter, a respective polishing process is carried out, e.g., a respective CMP (chemical mechanical polishing) process, whereby the above catalyst 51 on top of the nanowire/nanotube/nanofibre is removed.

Subsequently, as is illustrated in FIGS. 1a and 1b (corresponding to what is the case in conventional Phase Change Random Access Memory ("PCRAM") devices), the "switching active" material 2, for instance, the above Ge—Sb—Te ("GST") compound material 2 is deposited (here: on the upper surface of the nanowire/nanotube/nanofibre, and the upper surface of the above SiO2 layer 60, i.e., the whole memory array region). For depositing the "switching active" material 2, e.g., a respective PVD (physical vapor deposition) process, or e.g., a respective CVD (chemical vapor deposition) process might be used.

Afterwards, as also illustrated in FIGS. 1a and 1b (corresponding to what is the case in conventional Phase Change Random Access Memory ("PCRAM") devices), the electrode 3 is deposited on the "switching active" material 2, i.e., the whole memory array region. Thereafter, corresponding litho and etch processes are carried out such as to achieve that the electrode 3 and the "switching active" material 2—as illustrated in FIG. 1b-both e.g., have a substantially rectangular or square cross-section, and e.g., may have a width and length of e.g., about 1 F.

As is illustrated in FIG. 1a, the vertical axis of the "switching active" material 2 (and the electrode 3) is centered on the vertical axis of the nanowire/nanotube/nanofibre (i.e., the n-p-n-doped transistor regions 4a). The lower surface of the "switching active" material 2 contacts the upper surface of the nanowire/nanotube/nanofibre (and the upper surface of those parts of the SiO2 layer 60 which surround the nanowire/nanotube/nanofibre).

Thereafter, the above isolating material (not shown), e.g., SiO2 is deposited, which isolates associated pairs of switching active material 2/electrodes 3 from neighboring pairs of switching active material 2/electrodes 3. Afterwards, a respective polishing process is carried out, e.g., a respective CMP (chemical mechanical polishing) process (such as to polish the upper surface of the isolating material, and the electrode 3).

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory device, comprising: a transistor comprising at least one nanowire or nanotube or nanofibre and a transistor gate region, the nanowire or nanotube or nanofibre being self-aligned with respect to the transistor gate region; wherein the memory device is a resistively switching memory device; and wherein the nanowire or nanotube or nanofibre directly contacts a switching active material of the resistively switching memory device.

2. The memory device of claim 1, wherein a contacting area between the nanowire or nanotube or nanofibre and the switching active material of the resistively switching memory device has a width and/or length and/or diameter smaller than 1 1 F.

3. The memory device of claim 1, wherein a contacting area between the nanowire or nanotube or nanofibre and the switching active material of the resistively switching memory device has a width and/or length and/or diameter between 0.1 F and 1 F.

4. The memory device of claim 1, wherein a contacting area between the nanowire or nanotube or nanofibre and the switching active material of the resistively switching memory device has a width and/or length and/or diameter between 0.2 F and 0.5 F.

5. The memory device of claim 1, wherein the switching active material comprises a chalcogenide or a chalcogenide compound material.

6. The memory device of claim 5, wherein the switching active material comprises a GST compound material.

7. A memory device, comprising: a transistor comprising at least one vertically arranged nanowire or nanotube or nanofibre and a transistor gate region, the nanowire or nanotube or nanofibre being self-aligned with respect to the transistor gate region, wherein the memory device is a resistively switching memory device; and wherein one end of the vertically arranged nanowire or nanotube or nanofibre directly contacts a switching active material of the resistively switching memory device.

8. The memory device of claim 7, wherein another end of the vertically arranged nanowire or nanotube or nanofibre directly contacts a current line.

* * * * *